(12) United States Patent
Low et al.

(10) Patent No.: US 8,756,021 B2
(45) Date of Patent: Jun. 17, 2014

(54) METHOD AND SYSTEM FOR IN-SITU MONITORING OF CATHODE EROSION AND PREDICTING CATHODE LIFETIME

(75) Inventors: Russell J. Low, Rowley, MA (US); Kevin M. Daniels, Lynnfield, MA (US); Bon-Woong Koo, Andover, MA (US); Richard M. White, Newmarket, NH (US); James W. Blanchette, Haverhill, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 780 days.

(21) Appl. No.: 12/912,312

(22) Filed: Oct. 26, 2010

(65) Prior Publication Data

US 2012/0101742 A1    Apr. 26, 2012

(51) Int. Cl.
  *G01B 3/44*    (2006.01)
(52) U.S. Cl.
  USPC .......................................................... 702/34
(58) Field of Classification Search
  USPC .......................................................... 702/34
  See application file for complete search history.

(56) References Cited

U.S. PATENT DOCUMENTS

| | | | |
|---|---|---|---|
| 7,034,543 B2* | 4/2006 | Iwasawa | 324/525 |
| 7,655,931 B2* | 2/2010 | Gupta | 250/492.21 |
| 2001/0042836 A1* | 11/2001 | Olson et al. | 250/424 |
| 2004/0183470 A1* | 9/2004 | Geissler et al. | 315/248 |

* cited by examiner

*Primary Examiner* — Tung S Lau
*Assistant Examiner* — Xiuquin Sun

(57) ABSTRACT

A method of controlling operation of an indirectly-heated cathode (IHC) ion source includes a step of measuring a rate of loss of cathode weight of the IHC ion source that occurs during operation using a first cathode configuration and under a first set of operation conditions. A maximum weight loss for the first cathode configuration is determined, and a cathode lifetime is calculated based upon the rate of cathode weight loss and the maximum weight loss. A further method includes receiving a minimum source bias power value for operation of a cathode in a first configuration, measuring a rate of decrease in source bias power for a cathode in the first configuration, and calculating a lifetime of the cathode based upon the minimum source bias power and rate of decrease in source bias power.

6 Claims, 9 Drawing Sheets

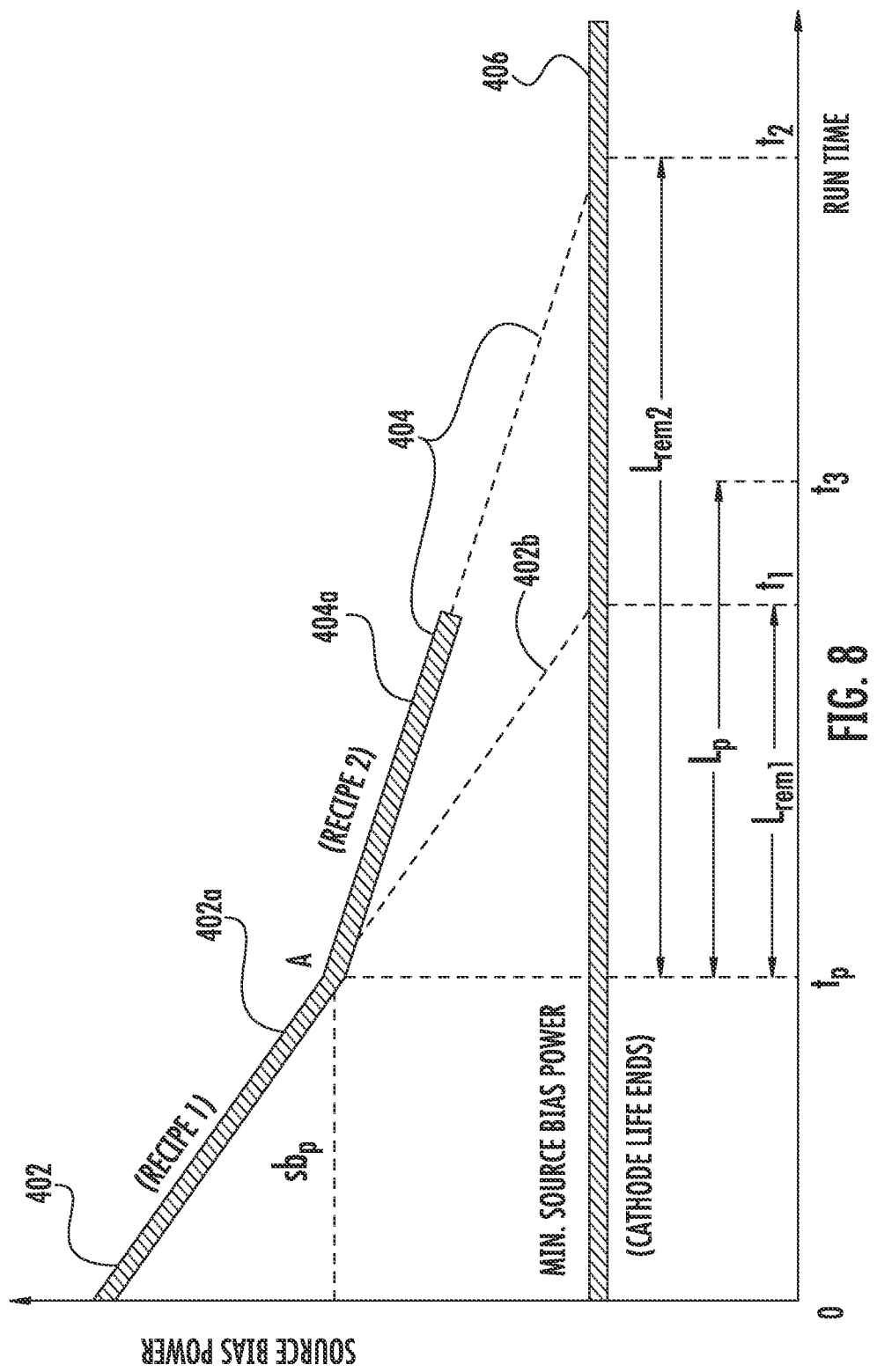

METHOD AND SYSTEM FOR IN-SITU MONITORING OF CATHODE EROSION AND PREDICTING CATHODE LIFETIME

BACKGROUND OF THE INVENTION

1. Field of the Invention

Embodiments of the invention relate to the field of ion sources used in ion implantation systems. More particularly, the present invention relates to a method for monitoring and evaluating ion source operation.

2. Discussion of Related Art

Ion implantation forms an integral part of modern device fabrication, including such devices as semiconductor integrated circuits and solar cells. In order to be cost effective, ion implanters must be capable of very high throughput and very long and stable operation. A vital component of each ion implanter is the ion source, of which there are several known configurations. For example, an ion source may be a Bernas type source or an Indirectly-Heated Cathode (IHC) ion source. A Bernas type source contains a cathode that includes a hot filament that is located within the region in which a plasma is generated. The requirement of immersion of a hot filament within the plasma can lead to undesirably rapid wear and failure of the relatively fragile filament.

The use of an IHC ion source provides an improved configuration over the Bernas source by placing a bulkier sacrificial component, that is, the cathode, between the filament and the plasma. In a typical IHC source, a cathode body comprises a hollow cylindrical shape that encloses the filament. The function of the filament (often referred to as a heater) is to heat the cathode. In particular, the filament is heated to thermionic emission temperatures by application of a DC current that passes through the filament. A bias voltage is applied between the filament and cathode causing the hot filament to emit electrons. The electrons emitted by the filament are accelerated by the bias voltage and heat the cathode by electron bombardment to temperatures in which thermionic emission occurs. A voltage (the arc voltage) is applied between the cathode and an arc chamber causing the hot cathode to emit electrons. Electrons emitted from the outer surface of the cathode initiate a plasma discharge from which ions can be extracted to form a beam that is used for ion implantation.

An IHC source is configured so that the outer surface of the cathode is immersed in the plasma, while the filament is enclosed and protected from gaseous species in the plasma. Because the bulkier cathode cylinder absorbs wear from the plasma while the enclosed filament does not, filament life is substantially increased leading to an overall increase in the useable life of IHC ion sources. Eventually, a portion of the wall of the IHC cylinder may be eroded away so as to create a hole (puncture) that exposes the filament to reactive gases, leading rapidly to source failure.

Although source failure in an IHC source may result when the filament fails, this knowledge may provide little insight into the IHC ion source lifetime. This is because such IHC ion sources operate for the vast majority of the time without the filament being exposed to reactive gases. Thus, although IHC ion sources enjoy improved life, during operation there may be a large uncertainty as to the actual useable life remaining for such sources. This may lead to unwanted failures of an ion implanter during operation if the IHC source is operated for too long a period or, alternatively, may require scheduling of PM of the ion source with unnecessary frequency in order to avoid such failures. Each of these cases may add significantly to the cost of device fabrication and may otherwise compromise implanter throughput. Accordingly, improved methods and systems for operating IHC ion sources are desirable.

SUMMARY OF THE INVENTION

Embodiments of the present disclosure are directed to methods and systems for monitoring ion source operation and ion source lifetime prediction. In an exemplary embodiment, a method of controlling operation of an indirectly-heated cathode (IHC) ion source includes measuring a rate of loss of cathode weight of said IHC ion source that occurs during operation of a cathode using a first set of operation conditions. A maximum weight loss for said cathode is determined at the set of operating conditions. The lifetime of the cathode is calculated based on the rate of loss and the maximum weight loss of the cathode.

In another exemplary embodiment, a method of controlling operation of an indirectly-heated cathode ion source includes. A minimum source bias power value corresponding to a source bias power at failure of a cathode of the ion source is received where the cathode has a first configuration. A plurality of bias power values are measured during operation of the IHC source. A rate of source bias power decrease is during operation under a first set of operation conditions based on the bias power values is determined. A first lifetime of the cathode is determined based upon the bias power values and the minimum source bias power. In one example, the minimum source bias power and/or the rate of source bias power decrease are measured using a test cathode having the first configuration. The method further involves calculating a lifetime of the first cathode based upon the first and second source bias power values and the minimum source bias power.

In another embodiment, a system for controlling operation of an indirectly-heated cathode ion source includes a processor and a memory operable to store cathode parameters that may include a present cathode weight loss ($WL_p$), a present source bias power ($sb_p$), a series of measurements of cathode weight and/or source bias power, a maximum cathode weight loss ($WL_{max}$), and a minimum source bias power ($sb_{min}$). The system further includes a computer-readable program operable in conjunction with the processor to determine, based upon the series of measurements, one or more of: a rate of loss of cathode weight ($R_{WL}$) a rate of decrease in source bias power ($r_{sb}$), and a remaining cathode lifetime $L_{rem}$, wherein the remaining cathode lifetime is determined by one or more of:

$$L_{rem}=(WL_{max}-WL_p)/R_{WL} \text{ and}$$

$$L_{rem}=(sb_p-sb_{min})/r_{sb}.$$

BRIEF DESCRIPTION OF THE DRAWINGS

FIG. 8 is a graph that illustrates aspects of cathode lifetime prediction using monitoring of source bias power.

DESCRIPTION OF EMBODIMENTS

Figure 1:
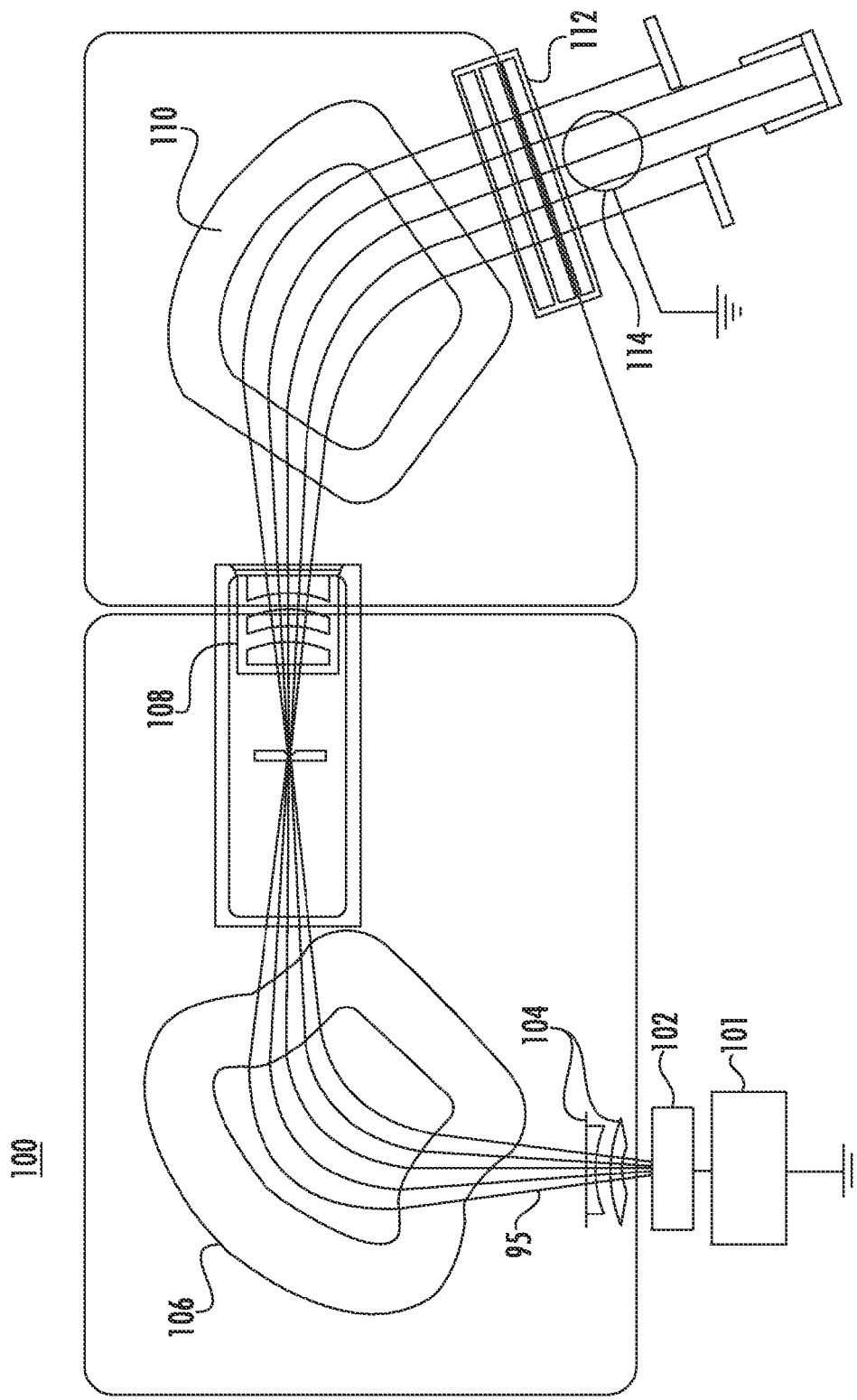
FIG. 1 is a schematic depiction a known ion implanter system that can be used in conjunction with methods and systems of the present invention.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

To solve the deficiencies associated with the methods noted above, novel and inventive techniques for monitoring and controlling ion source operation are needed. In particular, the present disclosure focuses on techniques involving measuring and predicting ion source operation, and more particularly, the lifetime of cathodes used in IHC ion sources designed for operation in ion implanters. Exemplary embodiments of the present disclosure provide for improved operation of high beam current (for example >60 mA ROI current (ROI=Region Of Interest)), high throughput ion implantation processes in which long and predictable production runs are desirable.

Referring to the drawings, FIG. 1 is a block diagram of an ion implanter 100 including an ion source chamber 102. A power supply 101 supplies the required energy to source 102 which is configured to generate ions of a particular species. The generated ions are extracted from the source through a series of electrodes 104 (extraction electrodes) and formed into a beam 95 which passes through a mass analyzer magnet 106. The mass analyzer is configured with a particular magnetic field such that only the ions with a desired mass-to-charge ratio are able to travel through the analyzer. Ions of the desired species pass through deceleration stage 108 to corrector magnet 110. Corrector magnet 110 is energized to deflect ion beamlets in accordance with the strength and direction of the applied magnetic field to provide a ribbon beam targeted toward a work piece or substrate positioned on support (e.g. platen) 114. In some cases, a second deceleration stage 112 may be disposed between corrector magnet 110 and support 114. The ions lose energy when they collide with electrons and nuclei in the substrate and come to rest at a desired depth within the substrate based on the acceleration energy.

Figure 2:
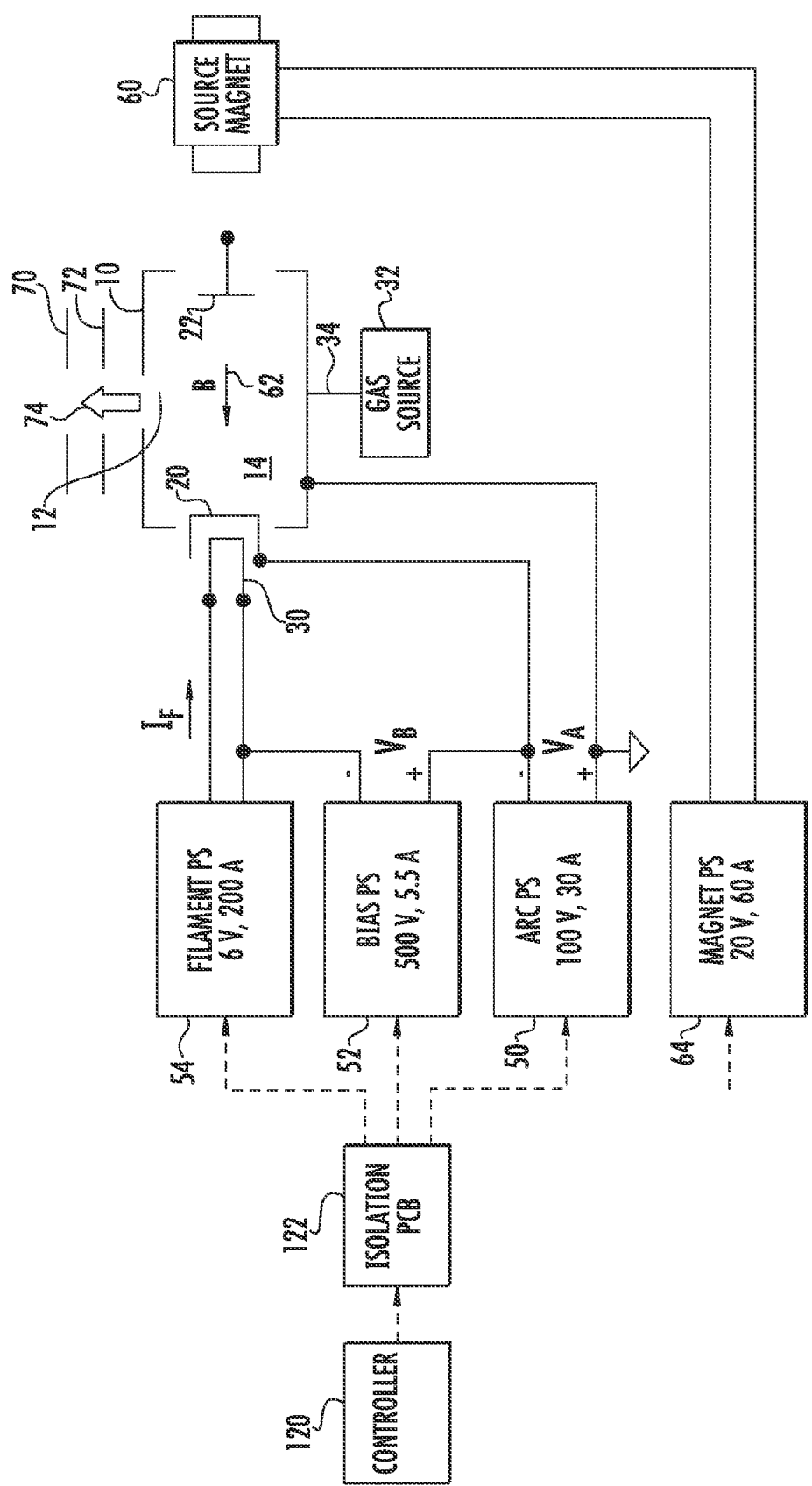
FIG. 2 is a schematic depiction of a known IHC ion source that can be used in conjunction with methods and systems of the present invention.

The present invention may be implemented in ion implantation systems, such as system 100. In particular, the present invention may be implemented using an indirectly heated (IHC) cathode ion source as ion source 102 that facilitate long production runs by offering stable ion source cathode operation in harsh plasma environments. A schematic illustration of an exemplary IHC cathode ion source that can be used in accordance with embodiments of the invention is shown in FIG. 2. However, the methods and systems of the present invention may be employed with any manner of IHC type ion sources. Moreover, the operating conditions discussed below for the IHC source of FIG. 2 are merely exemplary, and the present invention may be employed with IHC ion sources using substantially different operating conditions.

As depicted in FIG. 2, an arc chamber housing 10 having an extraction aperture 12 defines an arc chamber 14. A cathode 20 and a repeller electrode 22 are positioned within arc chamber 14. A filament 30, positioned outside arc chamber 14 in close proximity to cathode 20, produces heating of cathode 20. A gas to be ionized is provided from a gas source 32 to arc chamber 14 through a gas inlet 34. In another configuration, not shown, arc chamber 14 may be coupled to a vaporizer which vaporizes a material to be ionized in arc chamber 14.

An arc power supply 50 has a positive terminal connected to arc chamber housing 10 and a negative terminal connected to cathode 20. Repeller electrode 22 can be floating as shown in FIG. 2 or can be connected to the negative terminal of arc power supply 50. Arc power supply 50 may have a rating of 100 volts at 30 amperes and may operate at about 30-70 volts. The arc power supply 50 accelerates electrons emitted by cathode 20 into the plasma in arc chamber 14.

A bias power supply 52 has a positive terminal connected to cathode 20 and a negative terminal connected to filament 30. The bias power supply 52 may have a rating of 500 volts at 5.5 amperes and may operate at a current of about 5.0 amperes and a voltage of about 350 volts. The bias power supply 52 accelerates electrons emitted by filament 30 to cathode 20 to produce heating of cathode 20. A filament power supply 54 has output terminals connected to filament 30. Filament power supply 54 may have a rating of 6 volts at 200 amperes and may operate at a filament current of about 100 to 110 amperes. The filament power supply 54 produces heating of filament 30, which in turn generates electrons that are accelerated toward cathode 20 for heating of cathode 20.

A source magnet 60 produces a magnetic field B within arc chamber 14 in a direction indicated by arrow 62. Typically, source magnet 60 includes poles at opposite ends of arc chamber 14. The direction of the magnetic field B may be reversed without affecting operation of the ion source. Source magnet 60 is connected to a magnet power supply 64, which may have a rating of 20 volts at 60 amperes. The magnetic field produces increased interaction between electrons emitted by cathode 20 and the plasma in arc chamber 14. It will be understood that the voltage and current ratings and the operating voltages and currents of power supplies 50, 52, 54 and 64 are given by way of example only and are not limiting as to the scope of the invention.

An extraction electrode 70 and a suppression electrode 72 are positioned in front of extraction aperture 12. Each of extraction electrode 70 and suppression electrode 72 have an aperture aligned with extraction aperture 12 for extraction of a well-defined ion beam 74. Extraction electrode 70 and suppression electrode 72 are connected to respective power supplies (not shown). An ion source controller 120 may provide control of the ion source through an isolation circuit 122 or circuitry for performing the isolation function may be built into power supplies 50, 52 and 54. The ion source controller 120 may be a programmed controller or a dedicated special purpose controller. In one embodiment, the ion source controller is incorporated into the main control computer of the ion implanter. When the ion source is in operation, the filament 30 is heated resistively by filament current $I_F$ to thermionic emission temperatures, which may be on the order of 2200° C. Electrons emitted by filament 30 are accelerated by the bias voltage $V_B$ between filament 30 and cathode 20 and bombard and heat cathode 20. The cathode 20 is heated by electron bombardment to thermionic emission temperatures. Electrons emitted by cathode 20 are accelerated by arc voltage $V_A$ and ionize gas molecules from gas source 32 within arc chamber 14 to produce a plasma discharge. The electrons within arc chamber 14 are caused to follow spiral trajectories by magnetic field B. Repeller electrode 22 builds up a negative charge as a result of incident electrons and eventually has a sufficient negative charge to repel electrons back through arc chamber 14, producing additional ionizing collisions. The ion source of FIG. 2 exhibits good source lifetime because the filament 30 is not exposed to the plasma in arc chamber 14, and cathode 20 is more massive than conventional directly heated cathodes.

Figure 3:
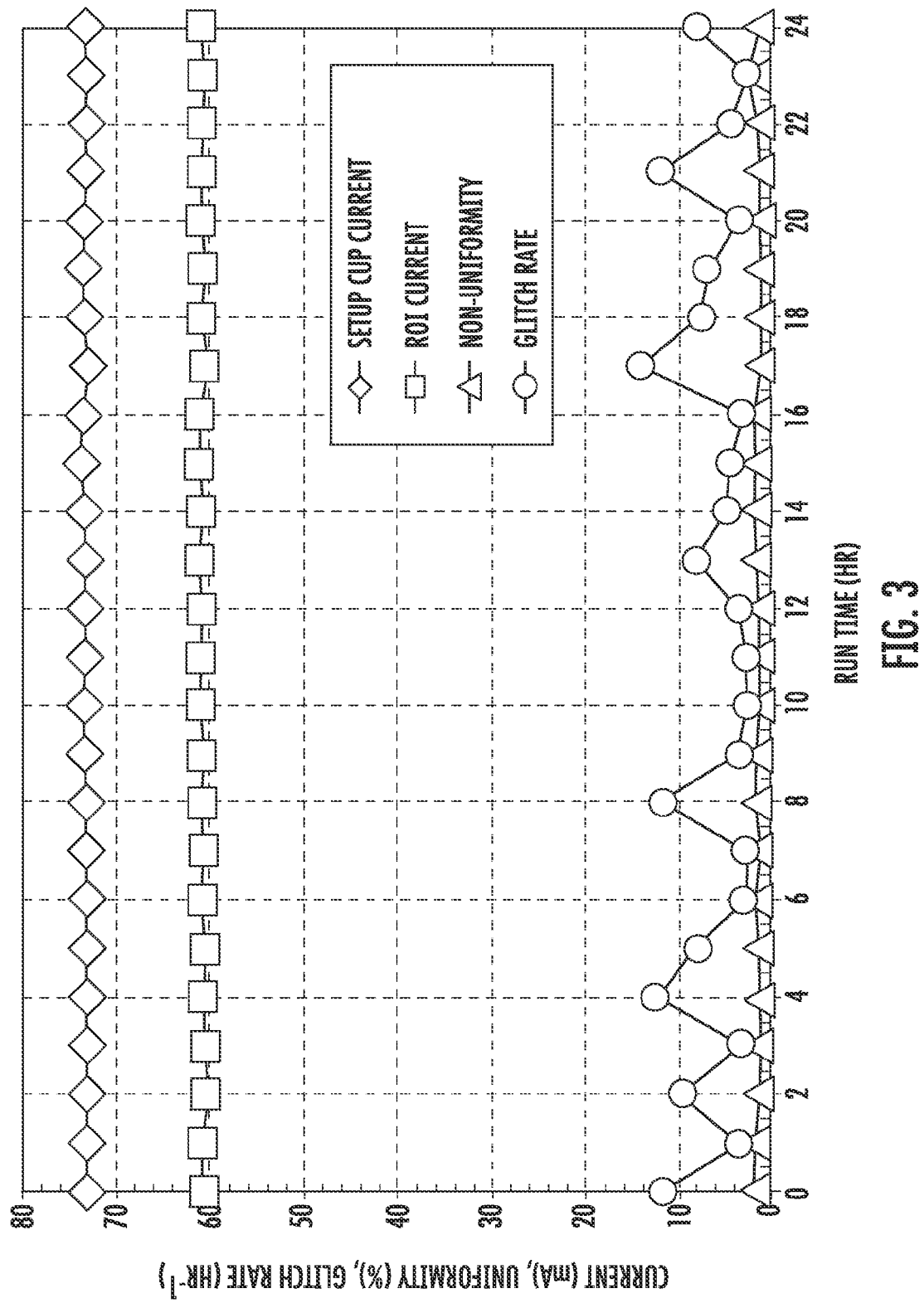
FIG. 3 presents a set of performance measurements for an IHC ion source.

FIG. 3 presents performance measurement data from an "endurance test" for an IHC ion source that may have some of the features generally illustrated in FIG. 2. As apparent from the duration of operation (24 hours), the ion source exhibits uniform performance over a long period. For example, the measured total beam currents in both a setup cup (located right after mass resolving slit in FIG. 1) and in a region of interest (ROI) (=wafer plane 114 in FIG. 1) are constant to within about one percent during the entire run time. In addition, the beam non-uniformity is relatively constant (<2% variation at wafer surface), and the glitch rate does not increase with run time.

The above characteristics illustrate that an IHC ion source can be well suited to applications where stable and long lasting performance are essential. However, during operation, cathode 20 is subject to gradual wear. For example, when reactive species are used in the plasma of arc chamber 14 to form a phosphorous beam in an ion implanter the thickness of the walls of cathode 20 may gradually erode, and puncture of the walls may occur in one or more places during operation before the ion source is scheduled for PM. In such a case, filament 30 becomes exposed to gaseous species of arc chamber 14, and rapid deterioration and failure of filament 30 may occur.

In order to maximize the efficient use of a tool employing an IHC source, such as an ion implanter, it is desirable to be able to operate the source as long as uniform and stable performance is possible without risking failure that may occur after the cathode is punctured. For example, if it were known that the cathode could be operated for 200 hours and would exhibit the performance shown in FIG. 3, but that failure would occur after 201 hours of operation, then a manufacturing process could be scheduled to take up to 200 hours of run time. After 200 hours of run time the tool containing the IHC source could be shut down with a PM scheduled to replace the cathode. However, without knowledge of when cathode failure will occur, it may be necessary to allow a large margin for error by replacing the cathode after 24 hours of use in order to avoid the risk of a failure during a production run. Accordingly, known protocols for equipment employing IHC ion sources may specify PM well before cathode replacement is actually needed. This results in inefficient and less cost effective uses of tools that employ IHC sources. Thus, knowledge of the erosion behavior of an IHC cathode exposed to plasmas could be used to develop tools and methods for predicting cathode lifetime and monitoring cathode use in an IHC ion source. In particular, the present inventors studied the erosion behavior of IHC cathodes under various sets of operating conditions, some of which are detailed in the experimental data shown in FIGS. 4a and 4b.

Figure 4A:
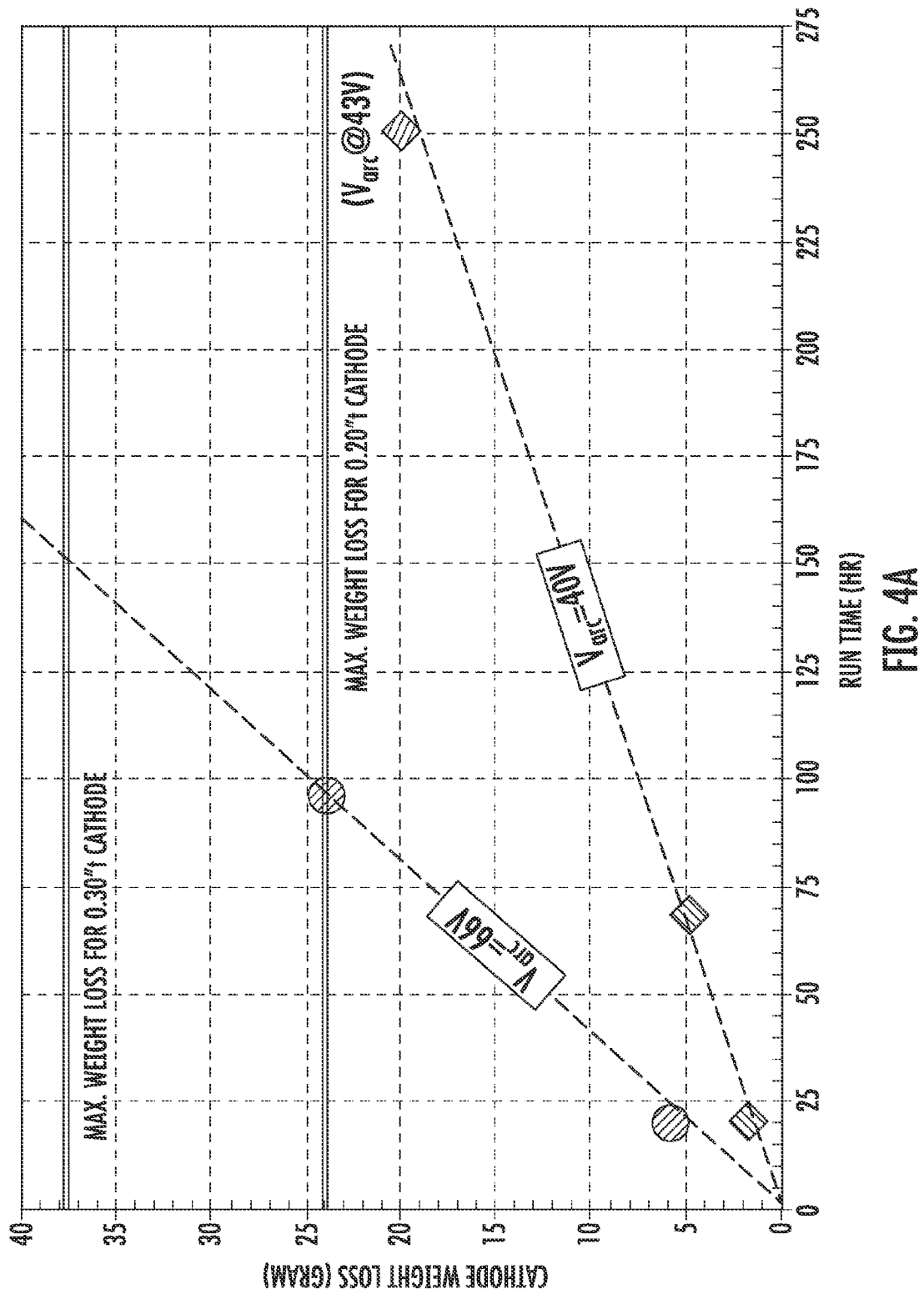
FIG. 4a is a graph that presents cathode weight loss data for IHC ion source cathodes that are operated under two different sets of operation conditions.

FIG. 4a presents experimental cathode weight loss data as a function of time for two different operating conditions of a cathode. The weight loss is measured with respect to an initial cathode weight before use in an IHC ion source. As noted above, cathode weight loss occurs due to erosion of the cathode walls during exposure to the reactive plasma formed in the arc chamber when the ion source is being operated. Erosion may take place due to a combination of reactive ion etching and physical sputtering. Before initial use (i.e. at time 0), the cathode weight loss is zero. After 20 hours of operation time, the cathode exhibits up to several grams of weight loss, depending on the arc voltage used. After longer run times, the cathode continues to lose weight for both arc voltages shown. The inventors have found that the rate of cathode weight loss (erosion rate) is substantially linear with operation time as illustrated in FIG. 4a.

As the cathode continues to operate, weight loss continues to occur up to the point of cathode failure. The cathode weight loss at the time of cathode failure can be termed "maximum weight loss," as illustrated in FIG. 4a for two different configurations of an IHC cathode. The term "configuration," as used herein with respect to a cathode, refers to qualities of the cathode that may include the cathode shape and size, relative cathode placement within the arc chamber, average cathode wall thickness and uniformity of thickness of the cathode walls and arc voltage values (66 v, 40V, etc.). In some IHC cathodes, the maximum weight loss may be about 50% of the initial cathode weight. Accordingly, by changing the cathode configuration, the maximum weight loss of the cathode varies. For example, as depicted in FIG. 4a, a 0.2" thick cathode may exhibit a maximum weight loss of about 24 g, while a 0.3" thick cathode may exhibit a maximum weight loss of about 37 g.

Figure 4B:
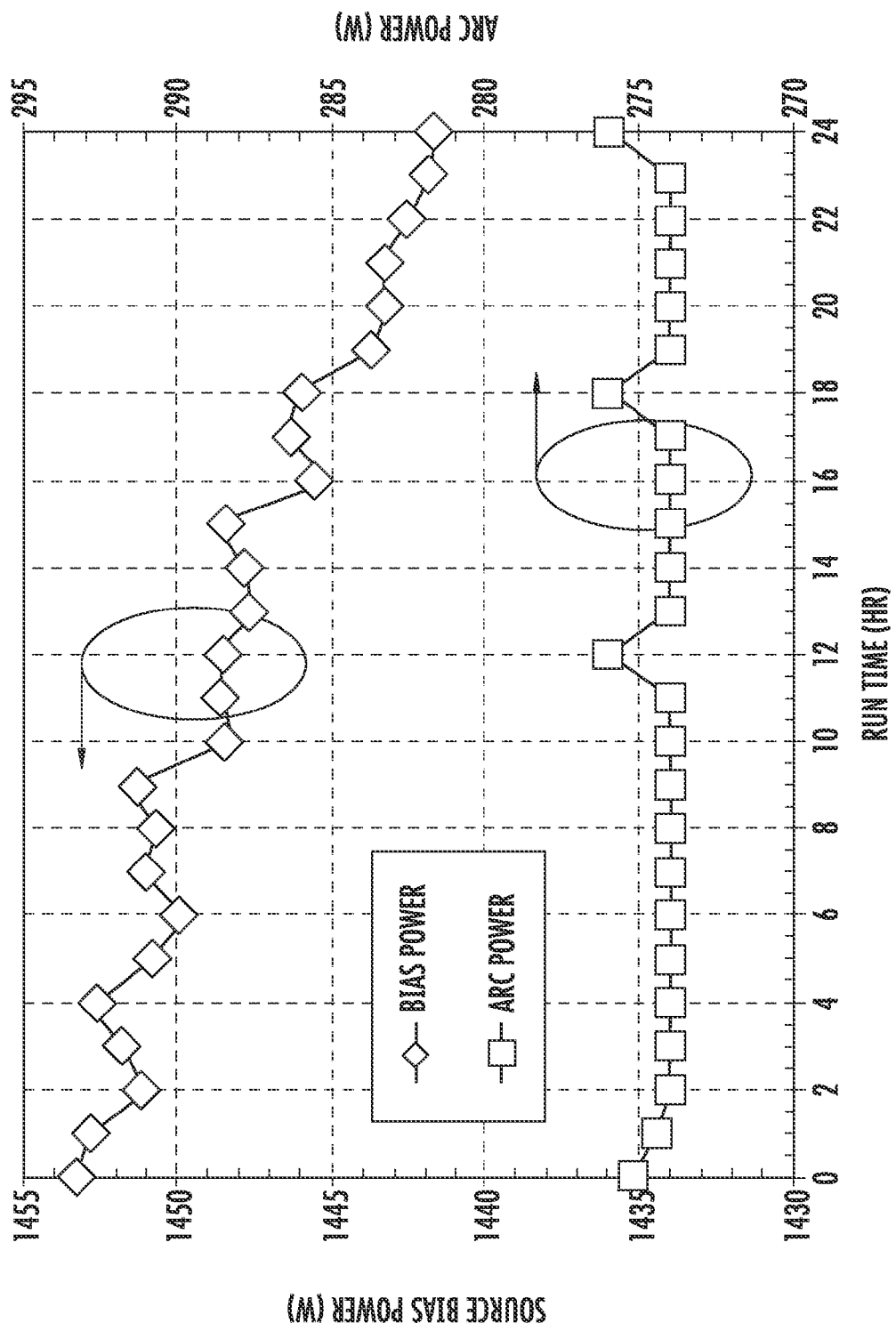
FIG. 4b is a graph that shows source bias power and arc power as a function of operating time for an IHC ion source.

Besides studying cathode weight loss, the present inventors documented systematic changes in electrical behavior of the cathode upon extended exposure to an IHC plasma. For example, FIG. 4b is a graph that shows source bias power and arc power as a function of operating time for an IHC ion source operated at 114.4 mA extraction current. The extraction current was kept constant during operation over the 24 hour period shown, thereby producing a constant arc power of about 274 W. Notably, the source bias power exhibits a substantially linear decrease as a function of time. This can be explained in the following manner. The source bias power constitutes the product of source bias voltage and source bias current. The decrease in source bias power with time indicates that the cathode requires less source bias power to emit electrons into the plasma as the cathode wears. In other words, the ion source is set to automatically extract a fixed current, which requires that the emission of primary electrons into the plasma by the cathode be kept substantially constant. Since the emission of primary electrons is dominated by thermionic emission from the cathode, the emitting temperature of the cathode should also be kept substantially constant to produce a constant emission of electrons. Thus, the data indicate that with increased run time, less source bias power is needed to keep the cathode at a constant thermionic emission temperature. This, in turn, is due to the fact that the volume (mass) of the cathode decreases constantly during operation, as detailed above. Thereby, less and less source bias power is needed to maintain a constant temperature in the continually decreasing mass of the cathode.

Accordingly, during operation at a constant extraction current, the linear decrease in source bias power of an IHC source can be monitored until cathode failure. Because the source bias power required to heat the cathode depends on the mass (weight) of the cathode, the minimum source bias power (that is, the source bias power level at the point of cathode failure) should correspond to a maximum cathode weight loss discussed above.

The present invention provides methods and systems for monitoring and controlling IHC ion source operation by determining source bias power levels during operation, as well as minimum source bias power levels.

Figure 5:
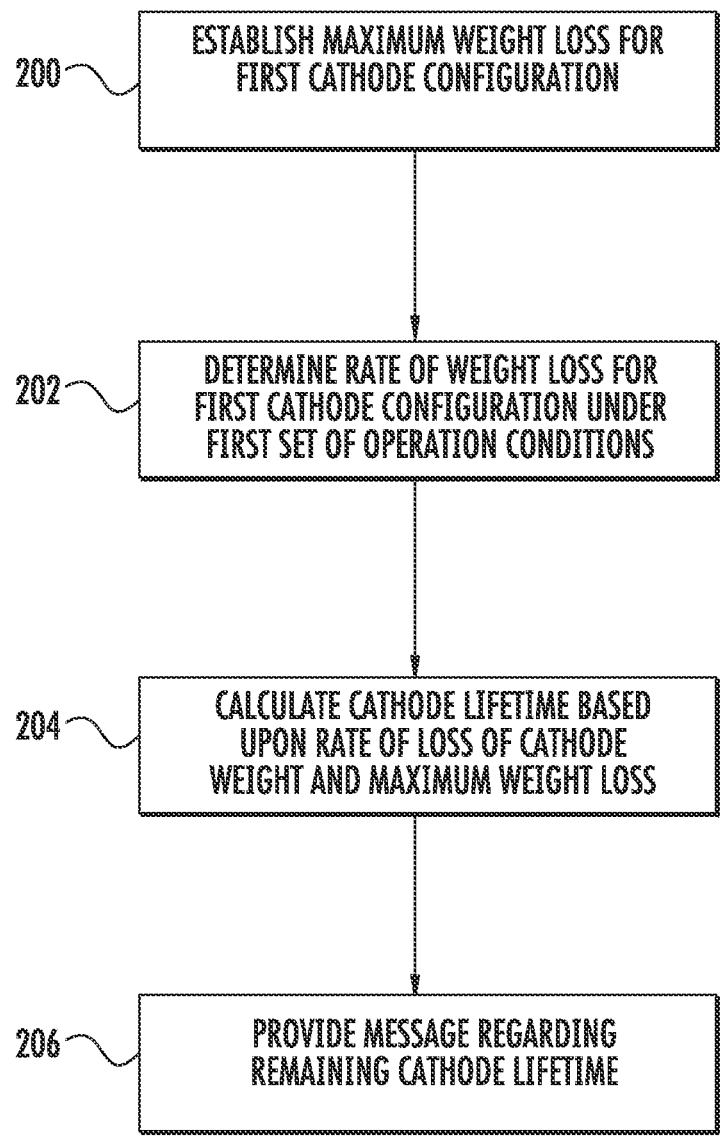
FIG. 5 depicts exemplary steps involved in a method for controlling operation of an IHC ion source.

As detailed below, the present invention provides for real time prediction of cathode lifetime based upon parameters associated with cathode weight loss during operation of the IHC ion source. FIG. 5 depicts exemplary steps involved in a method for controlling operation of an IHC ion source, according to an embodiment of the invention. At step 200, the maximum weight loss for a first cathode configuration is established. This may be accomplished using a test cathode having the first configuration. The initial cathode weight before use and the final cathode weight after failure of the test cathode are measured by any convenient means. For example, it may be of interest to establish the maximum weight loss for a cathode having a 0.3" wall thickness. Referring again to FIG. 3, it may be determined that the maximum weight loss for the 0.3" wall thickness cathode is about 37 g.

The term "test cathode," as used herein, refers to a cathode that may be operated in an ion source without performing an implantation process on production wafer hardware, so as not to compromise the hardware at the time of cathode failure. Thus, a test cathode may be used in accordance with the present invention to establish cathode parameters that are used to predict operation in real time of actual production cathodes. The production cathodes are meant to operate without failure to perform, for example, ion implantation processes on commercial wafers. However, step 200 may also be performed by collecting cathode weight loss data from one or more production cathodes that are inadvertently operated until failure.

As discussed previously, the maximum weight loss represents the cathode weight loss up to the point of failure. In general, the weight loss at the time of cathode failure may depend primarily on the cathode configuration and may not be sensitive to operation conditions. Accordingly, for a given cathode configuration, for example, a 0.3" wall thickness cathode, the maximum weight loss for a first test cathode of run at high arc voltage may be substantially the same as the maximum weight loss for a second test cathode run at lower arc voltage current.

At step 202, the rate of weight loss of a first cathode having the first configuration is measured for a first set of operation conditions. The rate of weight loss for the first cathode may be determined by performing a series of cathode weight measurements, as illustrated in FIG. 4a, and discussed above. In accordance with the invention, the series of measurements may be 2, 3, or more weight measurements, each conducted at a different time of operation under the first set of operation conditions. Thus, a line whose slope represents the rate of cathode weight loss may be determined from any number of a plurality of measurements.

The steps of establishing a maximum weight loss and a rate of weight loss for a given cathode configuration may be performed in any order if a different cathode is used for determining rate of weight loss as opposed to that used for determining maximum weight loss. Moreover, either or both steps may be performed on a plurality of cathodes. For example, a series of five test cathodes having a first configuration may each be operated until failure to produce an average maximum weight loss.

At step 204, a cathode lifetime based upon the rate of loss of cathode weight and the maximum weight loss is calculated. As used herein the term "lifetime" refers to a period of operation of a cathode before failure. The term "total lifetime" refers to the total period of operation before failure. For example, the total lifetime may be determined graphically by finding the abscissa coordinate of the intersection point of a line representing rate of cathode weight loss with a horizontal line representing the maximum weight loss. In the example for "Arc voltage=66V" shown in FIG. 4a, the total cathode lifetime for 0.3" thick cathodes is about 150 hours. Accordingly, based on the example of FIG. 4a, a user contemplating using a new 0.3" thick cathode in a run or series of runs to be operated at 66V may expect a total lifetime of about 150 hours.

However, the present invention also operates to provide real time information concerning the lifetime of an IHC cathode during use. For example, the exemplary steps 200-204 may be performed to provide a message indicating the expected remaining lifetime of a production cathode during use, as depicted at step 206. The term "remaining lifetime" refers to a present-time value of the cathode lifetime at a given point of operation. Thus, referring again to FIG. 4a, if a 0.3" thick cathode is initially operated for 20 hours at arc voltage of 66 V, the remaining lifetime ($L_{rem}$) for operation at 66V is about 130 (=150−20) hours.

Continuing with the example of FIG. 4a, step 204 may involve the sub-steps of determining the process history of a tool containing the IHC ion source (the process history in this example includes operation of the IHC ion source at 66V for 20 hours), determining the overall lifetime (150 hours for constant operation at 66V), and determining the remaining lifetime (130 hours at 66 V) based upon the overall lifetime and process history.

Step 206 may involve providing the predicted lifetime in a message displayed in a user interface, such as an electronic display associated with an ion implanter.

The methods described herein may be automated by, for example, tangibly embodying a program of instructions upon a computer readable storage media capable of being read by machine capable of executing the instructions. A general purpose computer is one example of such a machine. A non-limiting exemplary list of appropriate storage media well known in the art includes such devices as a readable or writeable CD, flash memory chips (e.g., thumb drives), various magnetic storage media, and the like.

In particular, steps 200-206 may be performed at least partially by a combination of an electronic processor, computer readable memory, and/or computer readable program. For example, measurements of a rate of cathode weight loss and maximum weight loss may be calculated and stored in memory with the aid of a computer processor/program. The computer memory may be further configured to receive and store process history information associated with operation of the IHC ion source. The computer processor may be configured to invoke a program to perform a lifetime calculation and a remaining lifetime calculation based upon the rate of loss, maximum weight loss, and process history parameters.

In accordance with the present invention, a computer linked to an ion implantation system may be configured to automatically determine $L_{rem}$ during a cathode run, and to provide $L_{rem}$ in a message. The computer may also be configured to automatically terminate a production run before $L_{rem}$ is reached, in a manner that does not compromise wafer hardware being processed.

The method of the invention generally illustrated in FIG. 5 may be used in many ways to provide a user timely lifetime information regarding an IHC ion source. For example, the data of FIG. 4a indicate that the cathode erosion rate is substantially linear for widely varying operating conditions. Accordingly, as detailed below, the present invention may be used to predict and provide to a user real time information regarding $L_{rem}$ even when the cathode has been subject to a variety of different processing conditions during prior runs.

Figure 6:
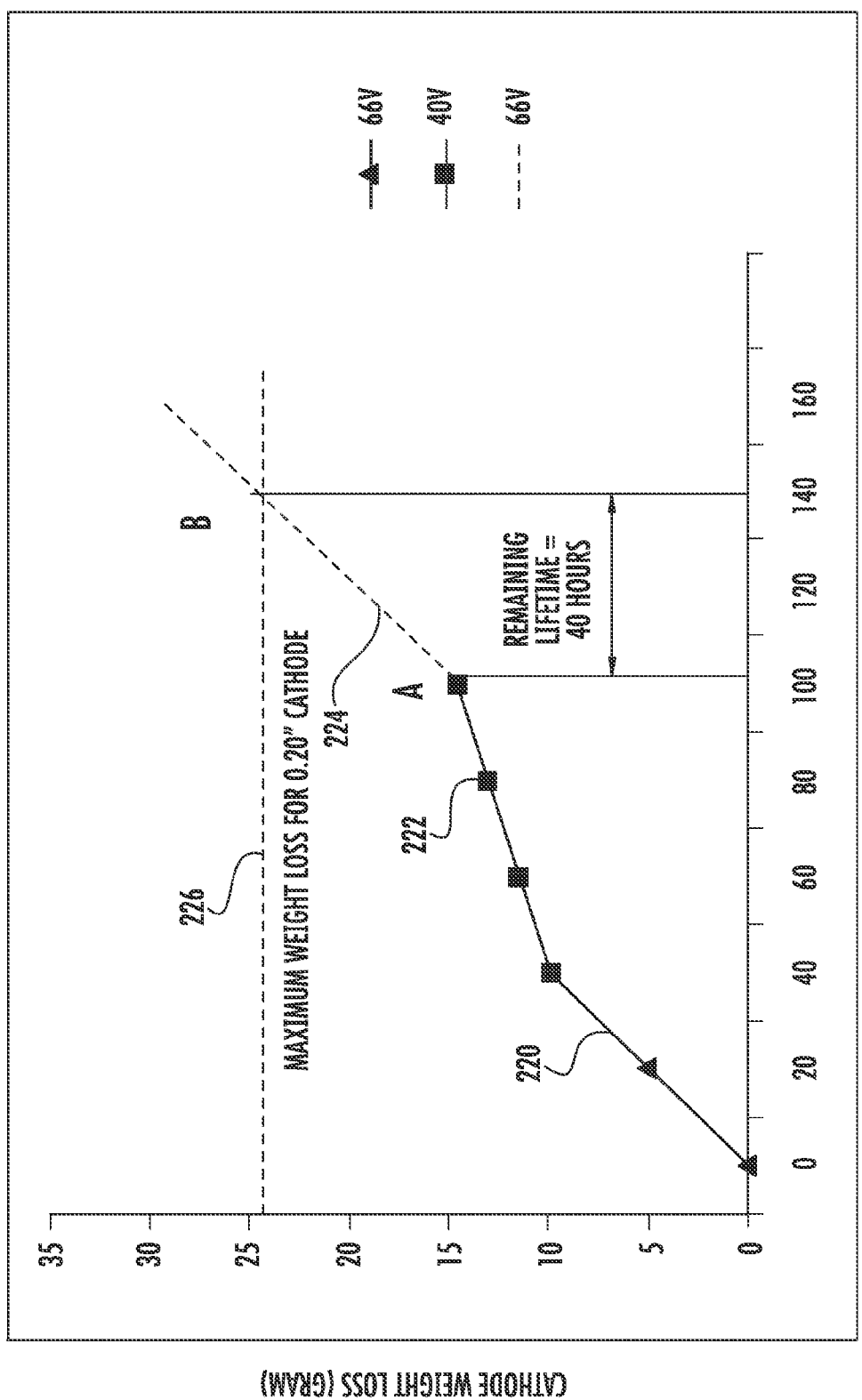
FIG. 6 is a graph that depicts an exemplary illustration of cathode lifetime prediction using the method of FIG. 5.

FIG. 6 depicts an exemplary use of the method illustrated in FIG. 5 to provide cathode lifetime prediction. Using data from FIG. 4a, FIG. 6 depicts a scenario in which an IHC ion source having a 0.2" thick cathode is operated at two different arc voltages, 66V for an initial 40 hours, followed by 40 V for an additional 60 hours. In FIG. 6, the slope of the line segments 220 and 222, representing the 66V and 40V runs, respectively, is depicted for illustration purposes as the same as the respective slopes illustrated in the experimental data of FIG. 4a. The slopes of the line segments may, in general, be derived for any combination of IHC cathode configuration and operating condition in accordance with the exemplary method of the invention described with respect to FIG. 5. The graph of FIG. 6 may be provided on a display. Alternatively, data derived from the graph may be supplied in a text message on a display or in other convenient form for a user. It will also be apparent to those of ordinary skill in the art that the calculation of $L_{rem}$ can be performed and presented to a user interface in numeric form without the use of any graphical representation.

FIG. 6 may represent the use of a high beam energy implantation process for an initial 40 hour run followed by a low beam energy implantation process for an additional 60 hour run. After a total of 100 hours of cathode use to perform the two different implantation runs, approximately 14.5 gram of cathode weight is lost.

FIG. 6 illustrates that this total weight loss may be determined graphically by adding together the individual line segments corresponding to the runs performed at 66V and 40V. It will be apparent that the total weight loss determination can also be performed by a processor by using linear equations that define the slope (rate of weight loss) and the duration of each run in order to calculate cathode weight loss for each run. The individual weight losses are then added together to arrive at the total weight loss.

Continuing with the example of FIG. 6, after 100 hours of use, a user may subsequently wish to perform another implantation process, if possible, before replacing the ion source cathode. For instance, the user may wish to perform a high beam current (66 V) ion implantation process for 30 hours if such a process can be performed without substantial risk of cathode failure. FIG. 6 graphically depicts that, for operation at 66V, the expected remaining cathode lifetime is about 40 hours. To illustrate this calculation, a line 224 having the slope equivalent to the rate of loss of cathode weight at 66V is constructed from point A, which represents the total cathode weight loss at present, 14.5 g. At point B, the line 224 intersects a horizontal line 226 representing the maximum weight loss at an abscissa value of about 140 hours. Thus, the ion source can be operated for about an additional 40 hours before predicted cathode failure.

The example of FIG. 6 is predicated upon the assumption that the maximum weight loss of the cathode is not sensitive to operation conditions, as discussed previously. In other words, cathode failure is assumed to take place when the cathode weight loss is about 24 g, no matter what combination of cathode operating conditions are used to produce the weight loss. Thus, embodiments of the present invention are capable of providing a prediction of remaining cathode lifetime even when the process history of a cathode involves many different runs (operations) conducted at many different operation conditions, to the extent that the rate of cathode weight loss and the duration of runs is known for each run. For any given process history, a quantity can be calculated that represents the present weight loss of a cathode, $WL_p$, which is the difference between the present cathode weight and the original cathode weight. For each different run of the cathode, the cathode weight loss incurred is equal to a product of the duration of run and the rate of weight loss for that run. Accordingly, for a cathode subjected to many different runs, $WL_p$ is the total weight loss incurred during all prior runs, and is equivalent to the sum of weight losses during each run. This quantity can be subtracted from the maximum weight loss ($WL_{max}$) to obtain the remaining usable cathode weight ($W_{rem}$). In order to determine $L_{rem}$, the rate of cathode weight loss ($R_{WL}$) for a proposed run should be specified. The $R_{WL}$ value for a given cathode can be calculated in accordance with the method set forth above and discussed with respect to FIG. 5. $L_{rem}$ can then be calculated as $W_{rem}/R_{WL}$.

Figure 7:
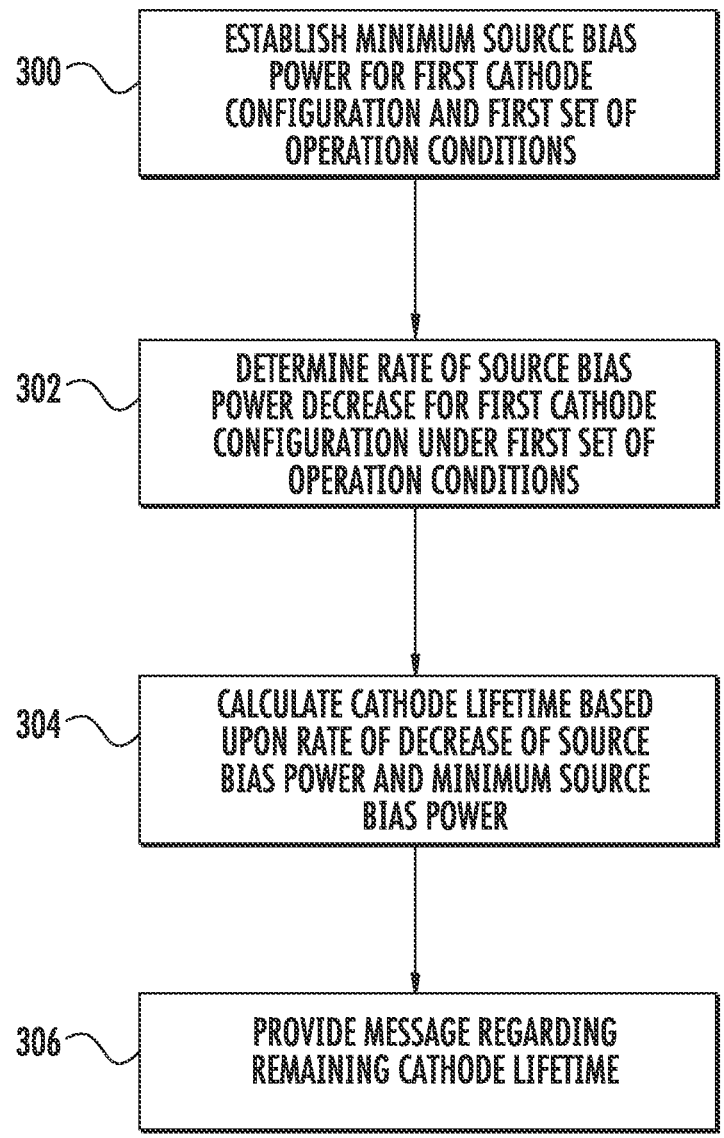
FIG. 7 shows exemplary steps involved in a method for controlling operation of an IHC source.

FIG. 7 illustrates exemplary steps involved in a method for controlling operation of an IHC source, in accordance with the invention. At step 300, a minimum source bias power is determined for a specific cathode configuration and set of operation conditions. Similarly to the method of the invention of FIG. 5, the minimum source bias power ($sb_{min}$) is a quantity that may be measured at the time of source failure using a test cathode, or it may be determined from the source bias power at cathode failure during a production run. In accordance with the present invention, the minimum source bias power may be determined in different ways, for example, by manual observation of operating conditions at failure, or from a log of ion source operating conditions that are automatically recorded during ion source operation up to the point of failure.

At step 302, a rate of source bias power decrease $r_{sb}$ for the specific cathode configuration is determined. This may be performed by measuring a source bias power $sb_1$ at a first time ($T_1$), measuring source bias power $sb_2$ at a second time ($T_2$), and dividing the difference in measured source bias power ($sb_1$-$sb_2$) by ($T_1$-$T_2$).

Similarly to the determination of maximum cathode weight loss and rate of weight loss, $sb_{min}$ and $r_{sb}$ may be determined using a test IHC cathode having the specific cathode configuration of interest.

At step 304, a cathode lifetime is calculated based upon the minimum source bias power $sb_{min}$ and the rate of decrease of source bias power $r_{sb}$ for the specific cathode configuration and operating conditions of interest. In one aspect of the invention, $sb_{min}$ and $r_{sb}$ for the specific cathode configuration are determined using data entirely from a test cathode. However, $r_{sb}$ may be determined during an actual production run for a cathode of interest, by measuring the rate of source bias decrease between two or more points in time during the production run.

In accordance with an aspect of the invention, step 304 provides a real time prediction of remaining cathode lifetime $L_{rem}$ at any point during the operation of a production cathode having the same configuration as a test cathode. This may be accomplished by subtracting the minimum source bias power $sb_{min}$ determined from the test cathode, from the present source bias power $sb_p$ of the production cathode. This difference $sb_p$-$sb_{min}$ is divided by $r_{sb}$ to yield the $L_{rem}$ for the production cathode.

In accordance with the invention, the calculation of $L_{rem}$ may be performed automatically during a production run. For example, a database linked to an ion implanter may be provided with $sb_{min}$ and $r_{sb}$, parameters for the currently used cathode. A processor linked to the ion implanter may monitor $sb_p$ during operation of the production cathode. When the processor determines that the difference between current source bias power and minimum source bias power $sb_p$-$sb_{min}$ is below a threshold, a program could be invoked to calculate $L_{rem}$ which may subsequently be provided in a message at a user interface.

At step 306 the remaining cathode lifetime is provided in a message. This may be performed in any convenient manner, as discussed above with respect to FIG. 5. In one example, $L_{rem}$ may be calculated during a production run, and a message provided to a user interface, such as "With the current recipe, the expected remaining source life is XXXX hours." Step 306 may be triggered automatically when a threshold is reached, as discussed above, or may be performed when a user enters information, such as a proposed recipe to be employed by the ion source.

FIG. 8 illustrates further aspects of a method for cathode lifetime prediction using source bias power, in accordance with the present invention. Curve 402 represents a rate of decrease in source bias power that may occur when operating a cathode under a first set of conditions (recipe 1), while curve 404 represents a decrease in source bias power that may occur while operating under a second set of conditions (recipe 2). Curve 402, for example, may represent operating under high arc voltage conditions/recipes, while curve 404 corresponds to operation under low arc voltages.

FIG. 8 illustrates how the remaining lifetime of a cathode is influenced by the choice of operating conditions. From point A, which may represent cathode conditions at $t_p$, the present time, the remaining lifetime until the cathode source is expected to fail ($L_{rem}$) is the run time from $t_p$ until the time when the source bias power reaches $sb_{min}$. If recipe 1 continues to be used, the remaining lifetime ($L_{rem1}$) is equal to $t_1-t_p$, while the remaining lifetime ($L_{rem2}$) is equal to $t_2-t_p$ if recipe 2 is used.

In one implementation of the present invention, remaining lifetime information, such as that derived from the operations disclosed in FIG. 8, may be provided as a graphical display to an ion implantation user. For example, a graph similar to FIG. 8 could be displayed to aid a user of an implantation tool in design of ion implantation runs. In one implementation, a graph may be provided in real time on a display. The graph may display a history of cathode operation. For example, if the ion source has been run up to point A, then segment 402a may be displayed. A computer program coupled to the ion implanter may be used to receive input from a user. The program may be configured to calculate remaining cathode lifetime based upon user input. For example, curves 402b and 404 may be output to the graphical display upon receiving input describing recipe 1 and recipe 2, respectively.

Thus, a user contemplating future production runs is apprised the predicted cathode lifetime for one or more cathode operating conditions, when the ion source is operated from point A onward. For example, the user is apprised that using recipe 1, the cathode life is predicted to end at time $t_1$, as depicted in line segment 402b. On the other hand, if recipe 2 is employed, at time $t_1$ appreciable cathode life would still remain, as illustrated by line segment 404a. This type of information would be especially valuable, for example, to a user having two sets of production wafers, where one set is scheduled to use recipe 1, and the other recipe 2. If both production runs were scheduled to be performed for a duration $L_{rem}$, each production run would end at time $t_3$ shown in FIG. 8. Since time $t_3$ substantially exceeds the predicted lifetime $L_{rem1}$ for running recipe 1 from the present time $t_p$, while $t_3$ is substantially less than the predicted lifetime $L_{rem2}$ for running recipe 2, the user would realize that only recipe 2, the low beam current process, can be safely used for a production run of duration $L_{rem}$.

In another implementation of the invention, the remaining cathode lifetime information may be output as text, numeric information, or any other convenient form. The present invention may also be employed to provide a user with a prediction of remaining cathode lifetime for a particular cathode without any history of cathode use. For example, a test cathode having a first configuration (for example, a 0.2" wall thickness) may be employed to determine a minimum source bias power $sb_{min}$ for 0.2" wall thickness cathodes. In addition, the rate of decrease in source bias power $r_{sb}$ may be determined using the test cathode under a first set of operation conditions (for example, a high beam current).

A user may subsequently desire to perform a high beam current production run using a 0.2" wall thickness production cathode after the cathode has been used for unspecified processes. In accordance with the present invention, the user may be provided with a prediction of $L_{rem}$ based upon the parameters $sb_{min}$ and $r_{sb}$ recorded from the test cathode. For example, referring again to FIG. 8, a user may wish to know the remaining lifetime of a production cathode that exhibits a present source bias power $sb_p$ corresponding to the source bias power level at point A. Without any knowledge of operation history of the production cathode, the user may enter in a user interface a set of parameters that includes the present source bias power of the first cathode $sb_p$, "recipe 1," and information indicating the first cathode has the 0.2" wall thickness configuration. A computer readable program receives this information, determines $sb_{min}$ for 0.2" wall thickness cathodes (for example, line 406), determines $r_{sb}$ corresponding to running 0.2" wall thickness cathodes at high beam current (for example, line 402), and determines a projected source bias curve (line 402b), which yields $L_{rem1}$.

Continuing with the same example, the user may alternatively measure the $r_{sb}$ of the present 0.2" wall thickness production run cathode, as well $sb_p$. For example, the user could perform a short test run with the production run cathode to monitor the decrease in source bias power with run time. In this manner, a more accurate calculation $L_{rem1}$ may be provided, since the rate of source bias power decrease in the present production run cathode may be slightly different than that measured for the test cathode having nominally the same configuration.

In one implementation of the invention, a computer system linked to an ion implanter may automatically calculate remaining cathode lifetime during a production run without user input. A processor/program may be provided to receive real time source bias power values that are output from a circuit coupled to the ion source that is configured to measure present source bias power $sb_p$ in real time during operation of the ion source. The processor may be further configured to calculate the $sb_p-sb_{min}$, and to calculate $r_{sb}$ in real time based upon the change of $sb_p$. In the latter example, the previously determined value of $sb_{min}$ may be supplied directly to the computer system or may be determined from a table that specifies $sb_{min}$ for a given configuration.

Herein, novel and inventive techniques for monitoring and predicting cathode lifetime are disclosed. The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. For example, the method of predicting cathode lifetime based upon cathode weight loss may be used in conjunction with the method of predicting cathode lifetime based upon source bias power decrease to provide a refined prediction of cathode lifetime, such as an average remaining lifetime based upon use of both methods.

Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of controlling operation of an indirectly-heated cathode (IHC) ion source, comprising:
   receiving a minimum source bias power value corresponding to a source bias power at failure of a cathode of said ion source, said cathode having a first configuration;
   measuring a plurality of bias power values during operation of said IHC source;
   determining, using an electronic processor, a rate of source bias power decrease during operation under a first set of operation conditions based on said measured plurality of bias power values; and
   calculating, using the electronic processor, a first lifetime of said cathode based upon said rate of source bias power decrease and said minimum source bias power; and
   providing a message of at a user interface of an ion implanter regarding the first lifetime.

2. The method of claim 1, further comprising receiving said first lifetime at a controller configured to automatically terminate operation of said ion source when said ion source is operated under said first set of operation conditions for a period that is no greater than said first lifetime.

3. The method of claim 1, wherein said determining said rate of source bias power decrease comprises:
   measuring a first source bias power value at a first time during operation under a first set of operation conditions of said first cathode; and
   measuring a second source bias power value at a second time different from the first time during operation of said first cathode under said first set of operation conditions.

4. The method of claim 1, wherein said calculating said first lifetime comprises:
   receiving a value representing a present source bias power;
   subtracting a difference between present source bias power and minimum source bias power; and
   dividing said difference by said rate of source bias power decrease.

5. The method of claim 1, further comprising:
   changing, at a third time, operation of said first cathode to a third set of operation conditions different from the first set of operation conditions;
   measuring at said third time, a third source bias power;
   calculating a second lifetime of said first cathode based upon said minimum source bias power, said third source bias power, and a rate of decrease of source bias power as a function of operating time under said third set of operation conditions; and
   providing said second lifetime in a user interface.

6. The method of claim 1, wherein said minimum source bias power is determined by operating, under a second set of operation conditions different from said first set of operation conditions, a second cathode having said first configuration, until failure in said second cathode.

* * * * *